United States Patent
Rasouli et al.

(10) Patent No.: US 9,020,084 B2
(45) Date of Patent: Apr. 28, 2015

(54) HIGH FREQUENCY SYNCHRONIZER

(71) Applicant: QUALCOMM Incorporated, San Diego, CA (US)

(72) Inventors: Seid Hadi Rasouli, San Diego, CA (US); Animesh Datta, San Diego, CA (US); Saravanan Marimuthu, Tamilnadu TN (IN); Ohsang Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 155 days.

(21) Appl. No.: 13/756,491

(22) Filed: Jan. 31, 2013

(65) Prior Publication Data

US 2014/0211893 A1  Jul. 31, 2014

(51) Int. Cl.
*H04L 7/00* (2006.01)
*H03K 3/356* (2006.01)

(52) U.S. Cl.
CPC ............ *H04L 7/0045* (2013.01); *H04L 7/0037* (2013.01); *H03K 3/356156* (2013.01)

(58) Field of Classification Search
CPC ....... H04L 7/00; H04L 7/0037; H04L 7/0041; H04L 7/0045; H03K 3/356156
USPC ........ 375/354; 327/142, 198, 199; 326/93, 94
See application file for complete search history.

(56) References Cited

U.S. PATENT DOCUMENTS

| | | | |
|---|---|---|---|
| 5,548,620 A | 8/1996 | Rogers | |
| 5,754,070 A * | 5/1998 | Baumann et al. | 327/198 |
| 5,793,227 A | 8/1998 | Goldrian | |
| 6,072,346 A * | 6/2000 | Ghahremani | 327/198 |
| 6,346,836 B1 * | 2/2002 | Wieberneit et al. | 327/144 |
| 7,977,975 B1 * | 7/2011 | Lewis et al. | 326/93 |
| 8,050,148 B2 | 11/2011 | Brantley et al. | |
| 8,305,125 B2 | 11/2012 | Tang et al. | |

FOREIGN PATENT DOCUMENTS

EP    0520127 A1    12/1992

* cited by examiner

*Primary Examiner* — Leon Flores
(74) *Attorney, Agent, or Firm* — Novak Druce Connolly Bove + Quigg LLP

(57) ABSTRACT

Techniques for resolving a metastable state in a synchronizer are described herein. In one embodiment, a circuit for resolving a metastable state in a synchronizer comprises a signal delay circuit coupled to a node of the synchronizer, wherein the signal delay circuit is configured to delay a data signal at the node to produce a delayed data signal, and a transmission circuit coupled to the signal delay circuit, wherein the transmission circuit is configured to couple the delayed data signal to the node after a delay from a first edge of a clock signal.

24 Claims, 6 Drawing Sheets

HIGH FREQUENCY SYNCHRONIZER

BACKGROUND

1. Field

Aspects of the present disclosure relate generally to synchronizers, and more particularly, to resolving a metastable state in a synchronizer.

2. Background

Two different blocks in a device may operate at different clock frequencies. As a result, when one of the blocks (a sender block) sends a data signal to the other block (a receiver block), the data signal is asynchronous with respect to the receiver block. In this regard, the receiver block may include a synchronizer to synchronize the incoming data signal with a clock of the receiver block. The synchronizer may do this by capturing data values of the data signal on the rising and/or falling edges of the receiver clock.

In order for the synchronizer to properly capture a data value of the data signal, the data signal should be stable for a time period before a rising or falling edge of the clock (setup time) and for a time period after the rising or falling edge of the clock (hold time). However, since the data signal is asynchronous with respect to the receiver block, the data signal may transition between values during the setup time and/or the hold time, resulting in a setup-time violation and/or a hold-time violation. When this occurs, the synchronizer may go into a metastable state that is neither a logic one nor a logic zero. If left unresolved, the metastable state can cause the receiver block to malfunction.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a circuit for resolving a metastable state in a synchronizer is described herein. The circuit comprises a signal delay circuit coupled to a node of the synchronizer, wherein the signal delay circuit is configured to delay a data signal at the node to produce a delayed data signal, and a transmission circuit coupled to the signal delay circuit, wherein the transmission circuit is configured to couple the delayed data signal to the node after a delay from a first edge of a clock signal.

A second aspect relates to a method for resolving a metastable state in a synchronizer. The method comprises delaying a data signal at a node in the synchronizer to produce a delayed data signal, and coupling the delayed data signal to the node after a delay from a first edge of a clock signal.

A third aspect relates to an apparatus for resolving a metastable state in a synchronizer. The apparatus comprises means for delaying a data signal at a node in the synchronizer to produce a delayed data signal, and means for coupling the delayed data signal to the node after a delay from a first edge of a clock signal.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
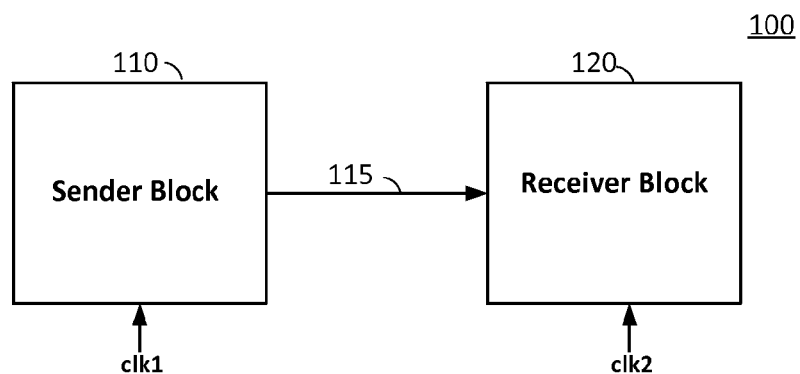
FIG. 1 shows a system that includes a sender block and a receiver block.

FIG. 1 shows an example of a system 100 comprising a sender block 110 and a receiver block 120, in which the sender block 110 sends a data signal to the receiver block 120 over a transmission medium 115 (e.g., a bus, a transmission line, etc.). For example, the sender block 110 may comprise a memory block and the receiver block 120 may comprise a processor, in which the memory block sends data read from memory to the processor for processing. The sender block 110 and the receiver block 120 may be integrated on the same chip (same die) or may be on separate chips.

The sender block 110 may operate according to a first clock signal clk1, and the receiver block 120 may operate according to a second clock signal clk2, in which the first and second clock signals clk1 and clk2 have different frequencies. Because of the different clock frequencies, the data signal from the sender block 110 is asynchronous with respect to the receiver block 120. In this regard, the receiver block 120 may include a synchronizer that synchronizes the incoming data signal from the sender block 110 with the second clock signal clk2 of the receiver block 120.

Figure 2:
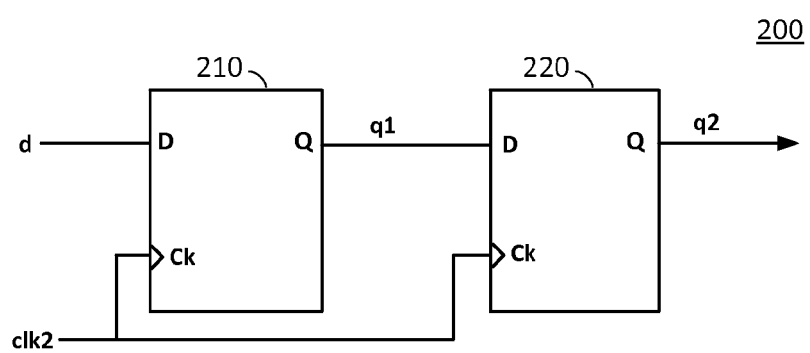
FIG. 2 shows a synchronizer that includes two flip-flops coupled in series.

FIG. 2 shows an example of a synchronizer 200 that may be included in the receiver block 120 to synchronize the data signal from the sender block 110 with the second clock signal clk2 of the receiver block 120. The synchronizer 200 comprises a first-stage D flip-flop 210 and a second-stage D flip-flop 220 coupled in series. Two D flip-flops 210 and 220 are used in the synchronizer 200 to reduce the probability of a metastable state occurrence or increase the mean time between failures (MTBF) due to metastability. The MTBF may be increased by adding additional D flip-flops to the synchronizer 200 at the expense of increased latency.

In operation, the data signal from the sender block 110 is input to the first-stage D flip-flop 210. The first-stage D flip-flop 210 captures a data value of the data signal on a rising or falling edge of the second clock signal clk2, and outputs the captured data value q1 to the second-stage D flip-flop 220 until the next rising or falling edge of the second clock signal clk2. The second-stage D flip-flop 220 captures the data value q1 output from the first-stage D flip-flop 210 on a rising or falling edge of the second clock signal clk2, and outputs the captured data value q2 until the next rising or falling edge of the second clock signal clk2.

Figure 3:
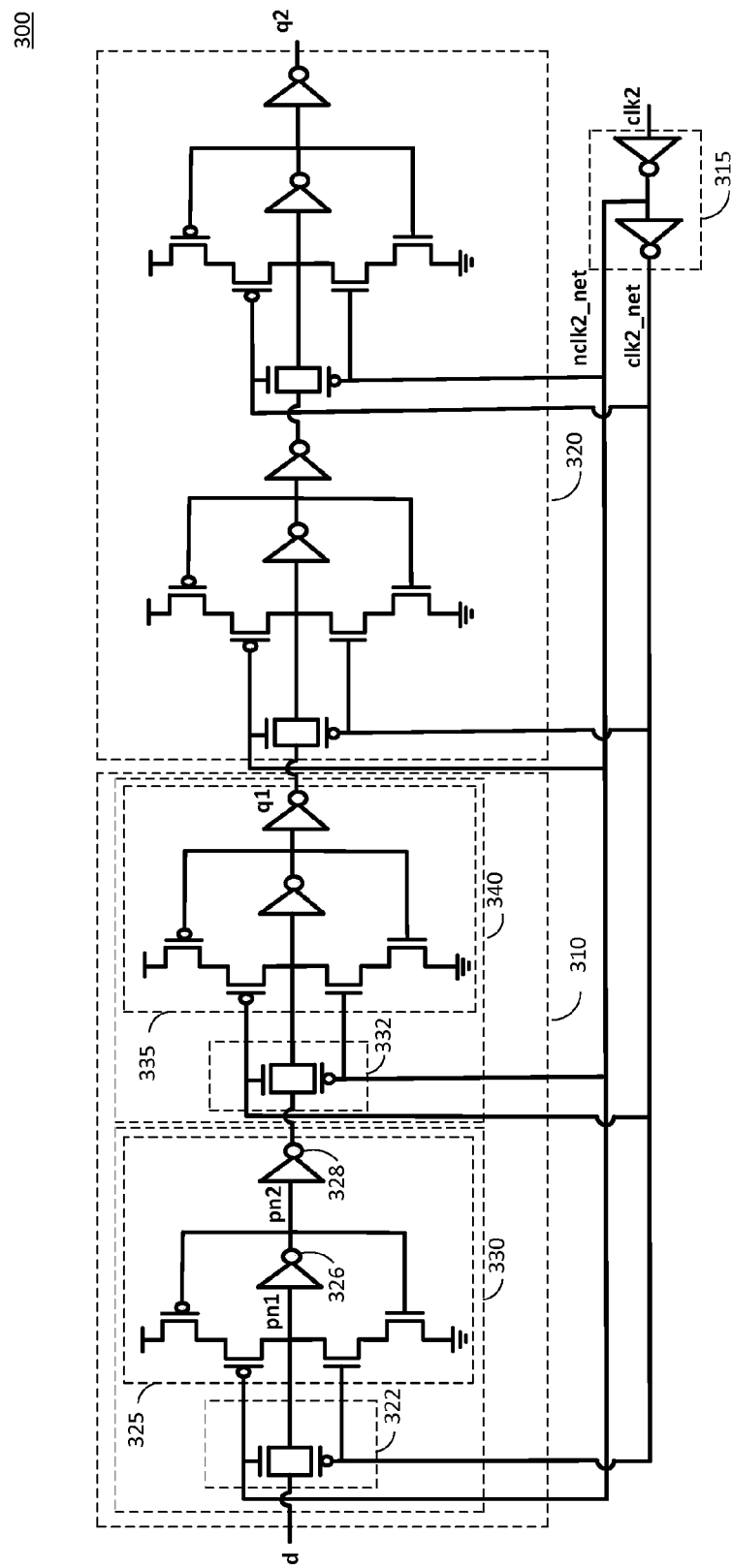
FIG. 3 shows an exemplary implementation of a synchronizer.

FIG. 3 shows an exemplary implementation of a synchronizer 300. The synchronizer 300 comprises a first-stage D flip-flop 310, a second-stage D-flip-flop 320, and a clock circuit 315. The clock circuit 315 receives the second clock signal clk2, and outputs a clock signal clk2_net having the same polarity as the second clock signal clk2, and a clock signal nclk2_net that is the logical inverse of the clock signal clk2_net. In the example shown in FIG. 3, the clock circuit 315 comprises two inverters in series.

The first-stage D flip-flop 310 includes a master latch 330 and a slave latch 340 coupled in series. The master latch 330 includes a first transmission gate 322 and a first storage circuit 325, and the slave latch 340 includes a second transmission gate 332 and a second storage circuit 335. The first transmission gate 322 is configured to pass the input data signal when the clock signal clk2_net is zero, and to block the input data signal when the clock signal clk2_net is one. The second transmission gate 332 is configured to pass the output of the master latch 330 when the clock signal clk2_net is one, and to block the output of the master latch 330 when the clock signal clk2_net is zero.

In operation, when the clock signal clk2_net is zero, the first transmission gate 322 passes the input data signal to the first storage circuit 325, and therefore allows the data signal to enter the master latch 330. When the clock signal clk2_net transitions from zero to one, the first storage circuit 325 stores the value of the input data signal on the rising edge of the clock signal clk2_net, and outputs the stored value to the slave latch 340 while the clock signal clk1_net is one. At about this time, the first transmission gate 322 blocks the input data signal, thereby isolating the first storage circuit 325 from the input data signal while the clock signal clk2_net is one. Thus, the master latch 330 captures (latches) the value of the input data signal on the rising edge of the clock signal clk2_net, and outputs the captured value to the slave latch 340 while the clock signal clk2_net is one.

When the clock signal clk2_net is one, the second transmission gate 332 passes the captured data value output from the master latch 330. As a result, the second transmission gate 332 transfers the data value captured by the master latch 330 to the second storage circuit 335 of the slave latch 340, and the second storage circuit 335 outputs the data value captured by the master latch 330.

When the clock signal clk2_net transitions from one back to zero, the second transmission gate 332 blocks the output of the master latch 330, thereby isolating the second storage circuit 335 from the master latch 330 while the clock signal clk2_net is zero. The second storage circuit 335 stores the captured data value transferred to the second storage circuit 335 from the master latch 330, and continues to output the captured data value until the next rising edge of the clock signal clk2_net. At the next rising edge of the clock signal clk2_net, the above operations are repeated.

Thus, the first-stage D flip-flop 310 captures a value of the data signal on the rising edge of the clock signal clk2_net, and outputs the captured data value until the next rising edge of the clock signal clk2_net (i.e., outputs the captured data value for one clock period).

The second-stage D flip-flop 320 may operate in a similar manner as the D first-flip 310, and therefore a detailed description of the second-stage D flip-flop 320 is omitted for sake of brevity. The second-stage D flip-flop captures the data value q1 output from the first-stage D flip-flop 310 on a rising edge of the clock signal clk2_net, and outputs the captured data value q2 until the next rising edge of the clock signal.

In order for the first-stage D flip-flop 310 to properly capture a data value of the data signal, the data signal should be stable for a time period before a rising edge of the clock (setup time) and for a time period after the rising edge of the clock (hold time). However, since the data signal from the sender block 110 is asynchronous with respect to the clock signal clk2_net, the data signal may transition between values during the setup time and/or the hold time, resulting in a setup-time violation and/or a hold-time violation. When this occurs, the synchronizer 300 may go into a metastable state that is neither logic one nor logic zero. If left unresolved, the metastable state can cause the receiver block 120 to malfunction.

When a node in the synchronizer 300 goes into a metastable state, the metastable state is eventually resolved into a valid logic value (one or zero) due to noise, variations in the power supply voltage, and/or other cause. The time required for a metastable state to resolve into a valid logic value (referred to as a resolution time) may limit the clock frequency of the synchronizer 300. This is because the clock period should be longer than the resolution time in order to give the synchronizer 300 enough time to resolve a metastable state. Accordingly, it is desirable to reduce the resolution time of a synchronizer to enable the synchronizer to operate at a higher clock frequency.

Figure 4:
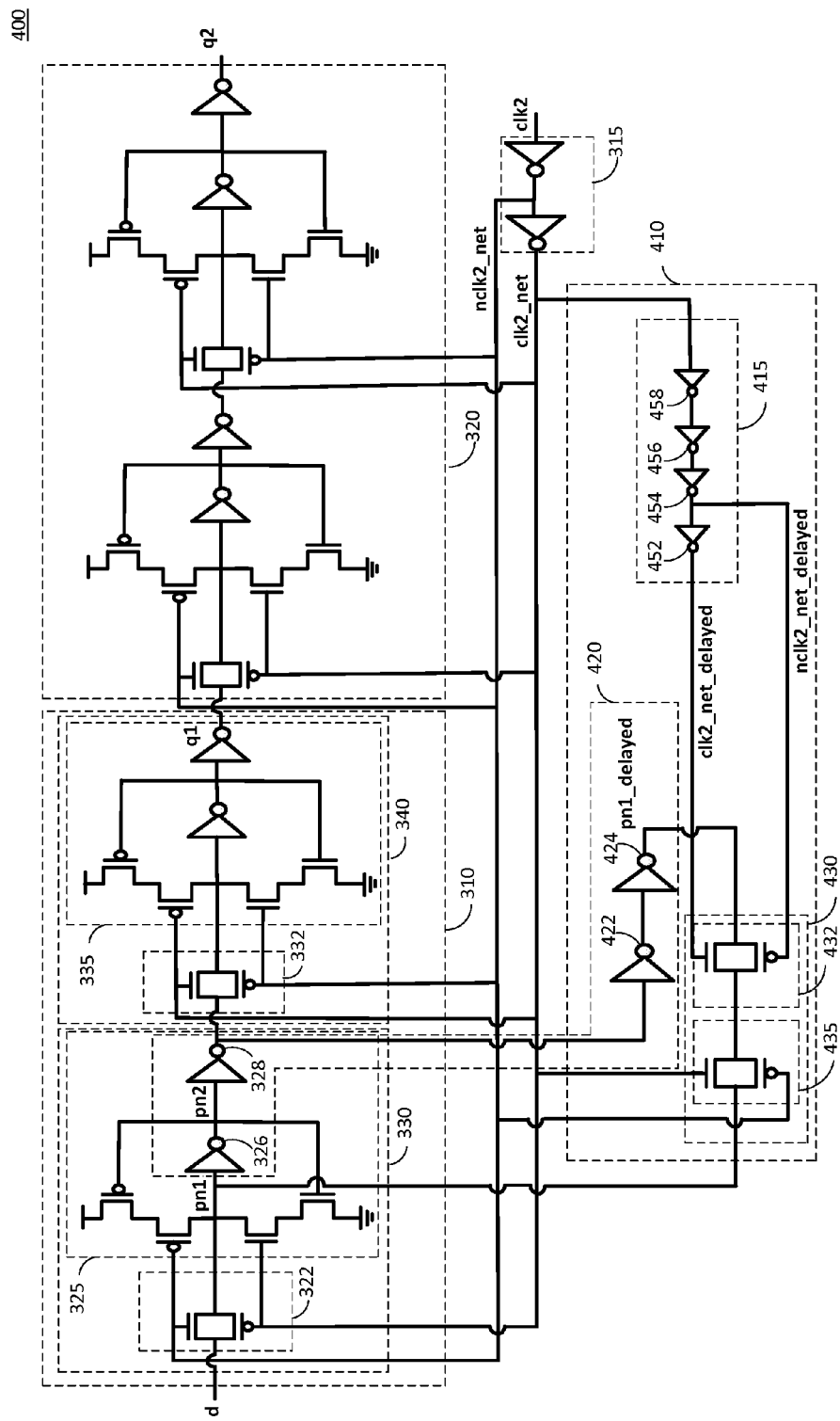
FIG. 4 shows a circuit for reducing the resolution time of a metastable state in a synchronizer according to certain embodiments of the present disclosure.

FIG. 4 shows a synchronizer 400 with reduced resolution time in accordance with embodiments of the present disclosure. The synchronizer 400 comprises a circuit 410 for reducing resolution time in the first-stage D flip-flop 310. The circuit 410 includes a signal delay circuit 420, a clock delay circuit 415, and a transmission circuit 430.

The signal delay circuit 420 may be coupled to node pn1 in the master latch 330. The signal delay circuit 420 may comprise multiple inverters coupled in series, forming an inverter chain. In the example shown in FIG. 4, the signal delay circuit 420 includes two inverters 326 and 328 in the master latch 330 coupled between node pn1 and the output of the master latch 330, and two additional inverters 422 and 424. The inverter chain causes the signal delay circuit 420 to produce a delayed version of node pn1 (referred to as pn1_delayed).

When node pn1 has a valid logic value, pn1_delayed has the same logic value as node pn1 after the delay caused by the inverter chain of the signal delay circuit 420. When node pn1 is in a metastable state, pn1_delayed is clean (has a logic one or a logic zero value). This is because the probability of all of the inverters in the inverter chain being in metastable states is remote even when node pn1 is in a metastable state.

The transmission circuit 430 selectively couples pn1_delayed output from the signal delay circuit 420 to node pn1. When the clock signal clk2_net is zero, the transmission circuit 430 decouples pn1_delayed from node pn1. On a rising edge of the clock signal clk2_net, the transmission circuit 430 initially leaves pn1_delayed decoupled from node pn1. After a delay from the rising edge, the transmission circuit 430 couples pn1_delayed to node pn1. This delay is controlled by the clock delay circuit 415, as discussed further below. In one embodiment, this delay is longer than the delay of the signal delay circuit 420.

If node pn1 has a valid logic value (i.e., is not in a metastable state), then pn1_delayed should have the same logic value as node pn1 when the transmission circuit 430 couples pn1_delayed to node pn1 after the delay from the rising clock edge. Since node pn1 and pn1_delayed have the same logic value in this case, normal operation of the synchronizer 400 is not changed.

If node pn1 is in a metastable state, then pn1_delayed has a valid logic value, as discussed above. As a result, pn1_delayed forces node pn1 to the logic value of pn1_delayed when the transmission circuit 430 couples pn1_delayed to node pn1 after the delay from the rising clock edge. Applying pn1_delayed to node pn1 resolves the metastable state at node pn1 sooner compared with the synchronizer 300 in FIG. 3, thereby reducing the resolution time. The reduction in the resolution time enables the synchronizer 400 to operate at a higher frequency than the synchronizer 300 in FIG. 3.

When node pn1 is in a metastable state, node pn2 in the master latch 330 may also be in a metastable state. In this case, resolving the metastable state at node pn1 may also resolve the metastable state at node pn2.

On a falling edge of the clock signal clk2_net, the transmission circuit 430 decouples pn1_delayed from node pn1. This is because, when the clock signal clk2_net transitions to zero, the first transmission gate 322 of the first-stage D flip-flop passes the input data signal to node pn1. As a result, node pn1 tracks the current value of the input data signal when the clock signal clk2_net is zero. If pn1_delayed has a different logic value than the current value of the input data signal, then coupling pn1_delayed to node pn1 may cause a short. This is prevented by having the transmission circuit 430 decouple pn1_delayed from node pn1 on the falling edge of the clock signal clk2_net.

As discussed above, the clock delay circuit 415 controls the delay between a rising edge of the clock signal clk2_net and the time that the transmission circuit 430 couples pn1_delayed to node pn1. To do this, the clock delay circuit 415 receives the clock signal clk2_net, delays the clock signal clk2_net to produce a delayed clock signal clk2_net_delayed, and outputs the delayed clock signal clk2_net_delayed to the transmission circuit 430. The transmission circuit 430 couples pn1_delayed to node pn1 on a rising edge of the delayed clock signal clk2_net_delayed, which is delayed from the corresponding rising edge of the non-delayed clock signal clk2_net.

In some embodiments, the clock delay circuit 415 comprises a plurality of inverters 452, 454, 456 and 458 coupled in series, forming an inverter chain. In these embodiments, the clock signal clk2_net propagates down the inverter chain of the clock delay circuit 415 to produce the delayed clock signal clk2_net_delayed.

In some embodiments, the delay of the clock delay circuit 415 is longer than the delay of the signal delay circuit 420 to give node pn1 more time to resolve a metastable state on its own before the transmission circuit 430 couples pn1_delayed to node pn1. This may be accomplished by implementing the clock delay circuit 415 with inverters having a longer delay than the inverters of the signal delay circuit 420. For example, the inverters of the clock delay circuit 415 may be made longer by using one or more stacked inverters, in which each stacked inverter comprises two or more stacked p-type field-effect transistors and two or more stacked n-type field-effect transistors.

In some embodiments, the transmission circuit 430 comprises a third transmission gate 432 and a fourth transmission gate 435 coupled in series. In this embodiment, the transmission circuit 430 couples pn1_delayed to node pn1 when both the third and fourth transmission gates 432 and 435 are on, and decouples pn1_delayed from node pn1 when one or both of the third and fourth transmission gates 432 and 435 are off. The third transmission gate 432 is on, and therefore passes pn1_delayed, when the delayed clock signal clk2_net_delayed is one, and is off when the delayed clock signal clk2_net_delayed is zero. The fourth transmission gate 435 is on when the non-delayed clock signal clk2_net is one, and is off when the non-delayed clock signal clk2_net is zero.

Figure 5:
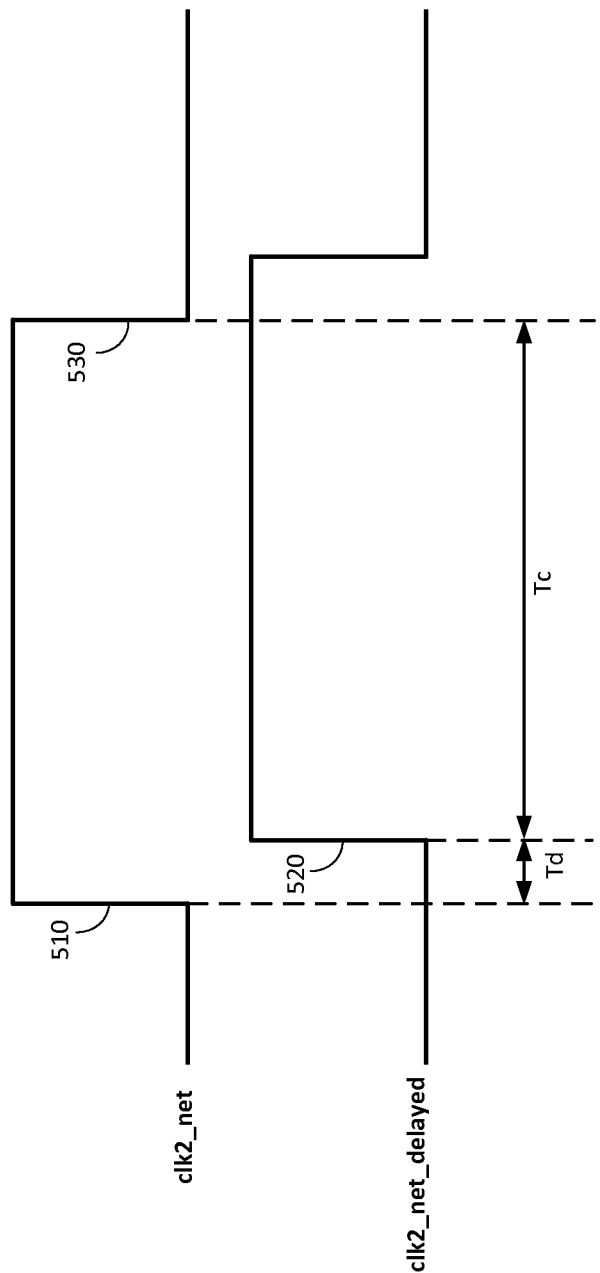
FIG. 5 shows a time diagram of two exemplary clock signals according to certain embodiments of the present disclosure.

Operation of the transmission circuit 430 may be explained with reference to FIG. 5, which shows an example of a time diagram for the delayed clock signal clk2_net_delayed and the non-delayed clock signal clk2_net. When both clock signals are zero, both the third transmission gate 432 and the fourth transmission gate 435 are off, and pn1_delayed is decoupled from node pn1. On a rising edge 510 of the non-delayed clock signal clk2_net, the fourth transmission gate 435 is turned on. However, the third transmission gate 432 is still turned off, and pn1_delayed remains decoupled from node pn1. On a rising edge 520 of the delayed clock signal clk2_net_delayed, the third transmission gate 432 is turned on, at which time both the third and fourth transmission gates 432 and 435 are turned on, and pn1_delayed is coupled to node pn1. As a result, the transmission circuit 430 couples pn1_delayed to node pn1 after a delay (denoted Td in FIG. 5) from the rising edge 510 of the non-delayed clock signal clk2_net. This delay may be longer than the delay of the signal delay circuit 420.

The fourth transmission gate 435 is turned off on the next falling edge 530 of the non-delayed clock signal clk2_net. As a result, the transmission circuit 430 decouples pn1_delayed from node pn1 on the falling edge of the non-delayed clock signal clk2_net. Thus, the transmission circuit 430 couples pn1_delayed to node pn1 for a time period (denoted Tc in FIG. 5) between the rising edge 520 of the delayed clock signal clk2_net_delayed and the falling edge 530 of the non-delayed clock clk2_net.

In the example shown in FIG. 4, the third transmission gate 432 comprises a n-type metal-oxide semiconductor (NMOS) transistor and a p-type metal-oxide semiconductor (PMOS) transistor coupled in parallel, in which the gate of the NMOS transistor is coupled to the delayed clock signal clk2_net_delayed, and the gate of the PMOS transistor is coupled to an inverse of the delayed clock signal nclk2_net_delayed. The fourth transmission gate 435 comprises a NMOS transistor and a PMOS transistor coupled in parallel, in which the gate of the NMOS transistor is coupled to the non-delayed clock signal clk2_net, and the gate of the PMOS transistor is coupled to an inverse of the non-delayed clock signal nclk2_net.

The synchronizer 400 shown in FIG. 4 is an example of a rising-edge triggered synchronizer that captures data values on the rising edges of the clock signal clk2_net. However, it should be appreciated that embodiments of the present disclosure are not limited to this example, and may also be applied to a falling-edge triggered synchronizer that captures data values on the falling edges of the clock signal clk2_net. For the falling-edge triggered case, the transmission circuit 430 may couple pn1_delayed to node pn1 after a delay from a falling edge of the clock signal clk2_net, and decouple pn1_delayed from node pn1 on the next rising edge of the clock signal clk2_net. In either case, the transmission circuit 430 may couple pn1_delayed to node pn1 after a delay from a clock edge at which a data value is captured (latched) by the synchronizer. Thus, embodiments of the present disclosure are applicable to both rising-edge triggered synchronizers and falling-edge triggered synchronizers.

Further, it should be appreciated that embodiments of the present disclosure are not limited to node pn1, and may be applied to other nodes along the data signal path of the synchronizer to resolve metastable states at other nodes. For example, the signal delay circuit 420 may delay the signal from another node in the synchronizer, and the transmission gate 430 may couple the delayed signal from the signal delay circuit to the other node after a delay from a rising or falling edge of the clock signal clk2_net. Thus, embodiments of the present disclosure are not limited to a particular node in a synchronizer.

Further, it should be appreciated that the signal delay circuit 420 may include any even number of inverters coupled in series. Also, the signal delay circuit 420 may include inverters 326 and 328 in the master latch 330 (as shown in the example in FIG. 4) or may only include inverters outside the master latch 330.

Figure 6:
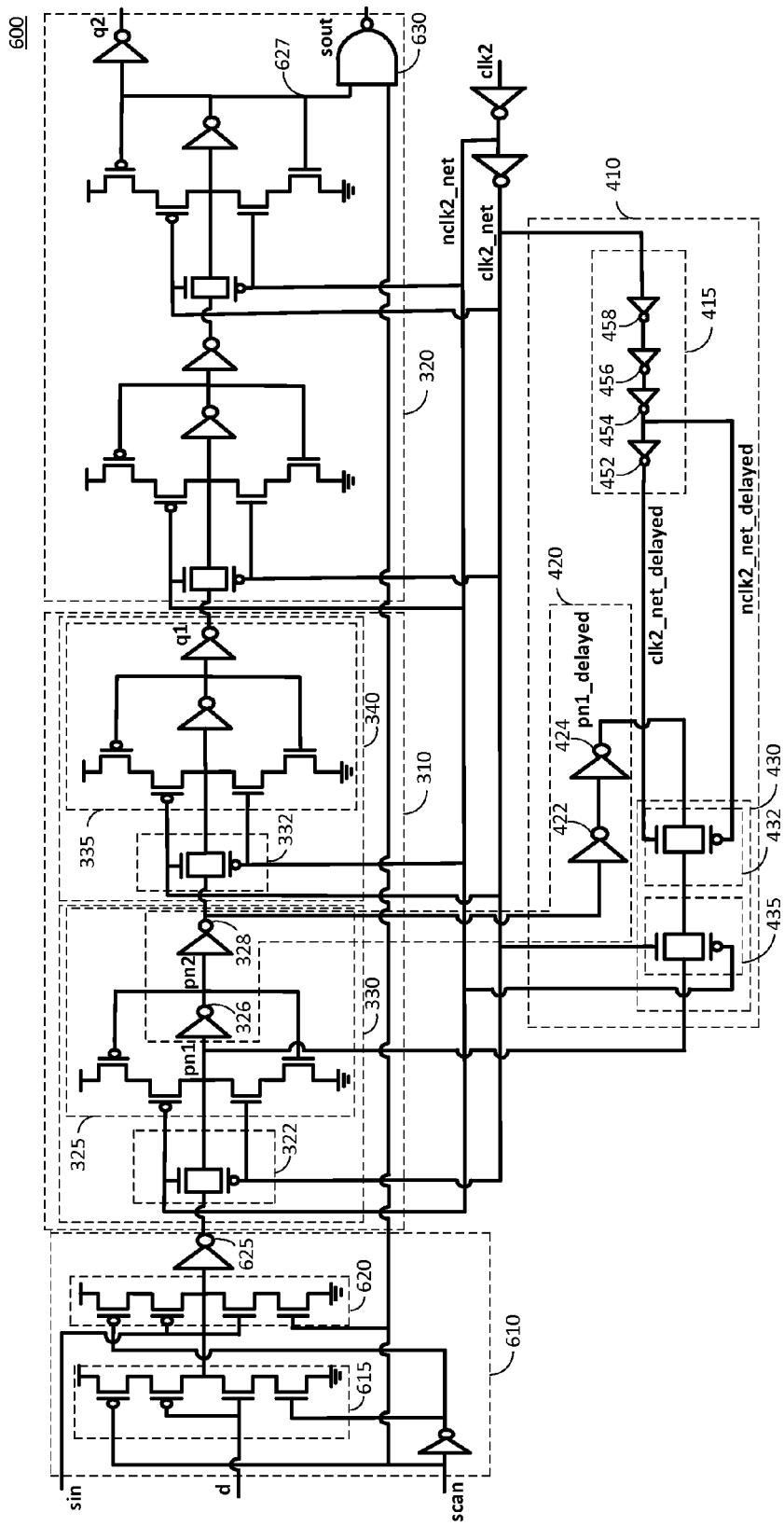
FIG. 6 shows a scannable synchronizer according to certain embodiments of the present disclosure.

FIG. 6 shows a scannable synchronizer 600 in accordance with embodiments of the present disclosure. The synchronizer 600 is capable of operating in a normal mode or a scan mode for testing the functionality of the synchronizer 600. In the normal mode, the synchronizer 600 operates in a similar manner as the synchronizer 400 in FIG. 4.

The synchronizer 600 comprises a scan multiplexer 610 and a NAND gate 630. The scan multiplexer 610 has a data input (denoted d) and a scan input (denoted sin). In the normal mode, the scan multiplexer 610 inputs a data signal from the sender block 110 received at the data input d to the first-stage D flip-flop 330 of the synchronizer 600. In the scan mode, the scan multiplexer 610 inputs a test signal received at the scan input sin to the first-stage D flip-flop 330. The test signal propagates through the synchronizer 600, and is output at the output of the NAND gate 630 (denoted sout). The output test signal may be analyzed to determine whether the synchronizer 600 is operating properly. For example, the input test signal may comprise a known test pattern, and the output test signal may be compared with an expected output test signal based on the known test pattern to determine whether the synchronizer 600 is operating properly.

In some embodiments, the scan input sin of the synchronizer 600 may be coupled to the scan output of another synchronizer, and the scan output sout of the synchronizer 600 may be coupled to the scan input of yet another synchronizer. This way, a test signal may be scanned through a chain of synchronizers to test the functionality of multiple synchronizers that include the synchronizer 600.

In the example shown in FIG. 6, the scan multiplexer 610 includes a first tri-state circuit 615, a second tri-state circuit 620, and a scan inverter 625. The first and second tri-state circuits 615 and 620 are controlled by a scan mode signal input to the scan multiplexer 610. The scan mode signal determines whether the scan multiplexer 610 operates in the scan mode or the normal mode. The scan multiplexer 610 operates in the normal mode when the scan mode signal is zero, and operates in the scan mode when the scan mode signal is one, as discussed further below.

When the scan mode signal is zero, the first tri-state circuit 615 inverts the input data signal, and the second tri-state circuit 620 passes the inverted data signal to the scan inverter 625. The scan inverter 625 inverts the inverted data signal, thereby restoring the logic state of the input data signal, and outputs the data signal to the first-stage D flip-flop 330.

When the scan mode signal is one, the first tri-state circuit 615 blocks the input data signal. The second tri-state circuit 620 inverts the input scan signal, and outputs the inverted scan signal to the scan inverter 625. The scan inverter 625 inverts the inverted scan signal, thereby restoring the logic state of the input scan signal, and outputs the scan signal to the first-stage D flip-flop 330.

An output 627 of the second-stage D flip-flop 320 is coupled to a first input of the NAND gate 630 and the scan mode signal is coupled to a second input of the NAND gate 630. When the scan mode signal is zero, the NAND gate 630 blocks the output 627 from the scan output sout. When the scan mode signal is one, the NAND gate 630 inverts the output 627, and outputs the inverted output as the scan output sout.

Figure 7:
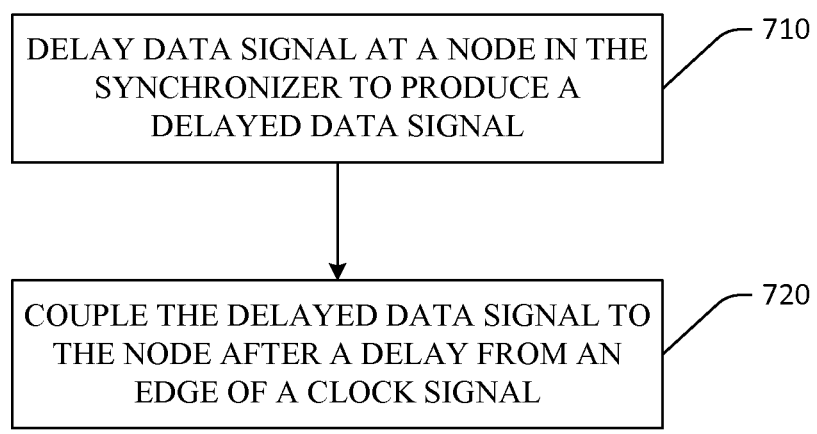
FIG. 7 is a flowchart illustrating a method for resolving a metastable state according to certain embodiments of the present disclosure.

FIG. 7 is a flow diagram of a method 700 for resolving a metastable state in a synchronizer in accordance with embodiments of the present disclosure.

In step 710, a data signal at a node in the synchronizer is delayed to produce a delayed data signal. For example, the node may be a node (e.g., node pn1) within a latch (e.g., the master latch 330) in the synchronizer. The data signal at the node may be delayed using a plurality of inverters coupled in series (e.g., the inverters 326, 328, 422 and 424 in the signal delay circuit 420).

In step 720, the delayed data signal is coupled to the node after a delay from an edge of a clock signal. For example, this may be accomplished by delaying the clock signal to produce a delayed clock signal, and coupling the delayed data signal to the node on an edge of the delayed clock signal. The clock signal may be delayed using a plurality of inverters coupled in series (e.g., the inverters 452, 454, 456 and 458 in the clock delay circuit 415). For the example in which the node is within a latch (e.g., the master latch 330), the latch may be configured to capture a value of the data signal at the node on the edge of the clock signal.

Those skilled in the art would appreciate that the circuits described herein may be realized using a variety of transistor types, and are therefore not limited to the particular transistor types shown in the figures. For example, transistor types such as bipolar junction transistors, junction field effect transistor or any other transistor type may be used. Those skilled in the art would also appreciate that the circuits described herein may be fabricated with various IC process technologies such as CMOS, bipolar junction transistor (BJT), bipolar-CMOS (BiCMOS), silicon germanium (SiGe), gallium arsenide (GaAs), etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A circuit for resolving a metastable state in a synchronizer, comprising:
    a signal delay circuit coupled to a node of the synchronizer, wherein the signal delay circuit is configured to delay a data signal at the node to produce a delayed data signal at an output of the signal delay circuit; and
    a transmission circuit coupled to the output of the signal delay circuit, wherein the transmission circuit is configured to couple the output of the signal delay circuit to the node after a delay from a first edge of a clock signal;

wherein the synchronizer includes a latch, the node is within the latch, and the latch is configured to capture a value of the data signal on the first edge of the clock signal.

2. The circuit of claim 1, wherein the signal delay circuit comprises a plurality of inverters coupled in series.

3. The circuit of claim 1, wherein the delay from the first edge of the clock is longer than the delay of the signal delay circuit.

4. The circuit of claim 1, further comprising a clock delay circuit configured to delay the clock signal to produce a delayed clock signal, and wherein the transmission circuit is configured to couple the output of the signal delay circuit to the node on an edge of the delayed clock signal.

5. The circuit of claim 4, wherein the delay of the clock delay circuit is longer than the delay of the signal delay circuit.

6. The circuit of claim 5, wherein the clock delay circuit comprises a plurality of inverters coupled in series.

7. The circuit of claim 6, wherein one or more of the inverters comprises a stacked inverter.

8. The circuit of claim 1, wherein the transmission circuit is configured to decouple the output of the signal delay circuit from the node on a second edge of the clock signal.

9. The circuit of claim 8, wherein the first edge of the clock signal is a rising edge and the second edge is a falling edge of the clock signal.

10. The circuit of claim 1, wherein the first edge of the clock signal is a rising edge.

11. A method for resolving a metastable state in a synchronizer, comprising:
    delaying a data signal at a node in the synchronizer using a signal delay circuit to produce a delayed data signal at an output of the signal delay circuit; and
    coupling the output of the signal delay circuit to the node after a delay from a first edge of a clock signal;
    wherein the synchronizer includes a latch, the node is within the latch, and the latch is configured to capture a value of the data signal on the first edge of the clock signal.

12. The method of claim 11, wherein delaying the data signal at the node comprises passing the data signal through a plurality of inverters coupled in series.

13. The method of claim 11, wherein the delay from the first edge of the clock signal is longer than the delay of the delayed data signal.

14. The method of claim 11, further comprising delaying the clock signal to produce a delayed clock signal, and wherein the coupling the output of the signal delay circuit to the node comprises coupling the output of the signal delay circuit to the node on an edge of the delayed clock signal.

15. The method of claim 14, wherein the delay of the delayed clock signal is longer than the delay of the delayed data signal.

16. The method of claim 11, further comprising decoupling the output of the signal delay circuit from the node on a second edge of the clock signal.

17. The method of claim 16, wherein the first edge is a rising edge of the clock signal and the second edge is a falling edge of the clock signal.

18. The method of claim 11, wherein the first edge of the clock signal is a rising edge.

19. An apparatus for resolving a metastable state in a synchronizer, comprising:
    means for delaying a data signal at a node in the synchronizer to produce a delayed data signal at an output of the means for delaying; and
    means for coupling the output of the means for delaying to the node after a delay from a first edge of a clock signal;
    wherein the synchronizer includes a latch, the node is within the latch, and the latch is configured to capture a value of the data signal on the first edge of the clock signal.

20. The apparatus of claim 19, wherein the delay from the first edge of the clock signal is longer than the delay of the delayed data signal.

21. The apparatus of claim 19, further comprising means for delaying the clock signal to produce a delayed clock signal, and wherein the means for coupling the output of the means for delaying to the node comprises means for coupling the output of the means for delaying to the node on an edge of the delayed clock signal.

22. The apparatus of claim 21, wherein the delay of the delayed clock signal is longer than the delay of the delayed data signal.

23. The apparatus of claim 19, further comprising means for decoupling the output of the means for delaying from the node on a second edge of the clock signal.

24. The apparatus of claim 23, wherein the first edge is a rising edge of the clock signal and the second edge is a falling edge of the clock signal.

* * * * *